United States Patent [19]

Otsuki et al.

[11] Patent Number: 4,559,569
[45] Date of Patent: Dec. 17, 1985

[54] CIRCUIT ARRANGEMENT FOR CORRECTING FREQUENCY RESPONSE IN ACCORDANCE WITH FREQUENCY RESPONSE OF A SOUND FIELD

[75] Inventors: Zenju Otsuki, Kawasaki; Mamoru Inami, Yokohama, both of Japan

[73] Assignee: Thomson-Brandt, Paris, France

[21] Appl. No.: 587,485

[22] Filed: Mar. 8, 1984

[30] Foreign Application Priority Data

Mar. 8, 1983 [JP] Japan ................................. 58-38033
Mar. 8, 1983 [JP] Japan ............................ 58-33316[U]

[51] Int. Cl.⁴ .......................... G11B 5/45; G11B 5/02
[52] U.S. Cl. .................................... 360/65; 333/28 R
[58] Field of Search ..................... 333/28 R; 381/103; 378/12, 14; 360/65; 330/304

[56] References Cited

U.S. PATENT DOCUMENTS

4,340,780  7/1982  Odlen ..................................... 179/1

FOREIGN PATENT DOCUMENTS

| 0050067 | 4/1982 | European Pat. Off. | ............ 381/103 |
| 2457703 | 12/1980 | France | ................................. 381/103 |
| 56-17507 | 2/1981 | Japan | ................................... 381/103 |
| WO81/02658 | 9/1981 | PCT Int'l Appl. | ................. 381/103 |
| 2033689 | 5/1980 | United Kingdom | ................ 381/103 |
| 2054994 | 2/1981 | United Kingdom | ................ 381/103 |
| 2068678 | 8/1981 | United Kingdom | ................ 381/103 |

OTHER PUBLICATIONS

Audio Engineering Society Preprint, No. 1680 (E-3), presented at the 67th Convention, Oct. 31,-Nov. 3, 1980, pp. 1-16, New York, US, R. W. Adams: "An Automatic Equalizer/Analyzer".

*Primary Examiner*—Vincent P. Canney
*Attorney, Agent, or Firm*—Pollock, Vande Sande & Priddy

[57] ABSTRACT

In a circuit arrangement for automatically correcting frequency response so as to set a desired frequency response in view of a frequency response of a sound field, a frequency response control circuit is improved such that precise level control at a number of bands is effected with a simple structure. A microcomputer is used to determine the difference between a desired frequency response curve and a frequency response curve obtained by measuring the sound pressure level in a sound field, to which pink noise or the like is emitted through the frequency response control circuit, so as to produce a control signal used in the frequency response control circuit to give a desired frequency response to an audio signal. The frequency response control circuit comprises an amplifier, a plurality of resonance circuits corresponding to the bands, a plurality of variable resistor circuits each including a parallel circuit of a plurality of series circuits of a resistor and an analog switch; and an interface circuit responsive to serial data of the control signal from the microcomputer for controlling the analog switches.

14 Claims, 20 Drawing Figures

← TAPE MOTION

← TAPE MOTION

CIRCUIT ARRANGEMENT FOR CORRECTING FREQUENCY RESPONSE IN ACCORDANCE WITH FREQUENCY RESPONSE OF A SOUND FIELD

BACKGROUND OF THE INVENTION

This invention relates generally to frequency response control in an audio system having a speaker for emitting an audio signal to a sound field, and more particularly to a circuit arrangement which corrects frequency response in accordance with frequency response or acoustic characteristic of a sound field.

Frequency response of an audio system has hitherto been controlled by way of a graphic equalizer so that a desired frequency response results. When it is intended to take the frequency response of a sound field, such as a listening room, into account, the frequency response determined by the acoustic characteristic of the sound field is first measured, and necessary correction or compensation is then effected. Although such control can be manually effected, it is time-consuming and troublesome, and therefore automatic frequency response control circuits have recently developed.

One example of such a known automatic equalizer/analyzer is disclosed in a publication from AUDIO ENGINEERING SOCIETY, which includes information presented at the 64th Convention, Oct. 31–Nov. 3, 1980 in New York. According to the technique disclosed by Robert W. Adams of dbx, Inc. a digitally controlled 10-band equalizer is used where the equalizer comprises 10 filters and 10 D/A converters. Namely, the equalizer requires a plurality of filters and D/A converters whose number equals the number of bands to be controlled. The equalizer is controlled by a computer which is required to output band select data of 4-bit and level control data of 8-bit, where these data are fed to the D/A converter of the equalizer in parallel bit form. Therefore, the number of connecting lines between the computer and the equalizer is large, while the structure of the equalizer is complex. In addition, when an equalizer is constructed by a plurality of band pass filters, distortion is apt to occur due to phase variation.

Another prior art reference, i.e. Japanese Patent Provisional Publication No. 56-17507 (Application No. 54-93498) published on Feb. 19, 1981, discloses a digitally controlled signal control device in which an input audio signal is level controlled by a digital signal formed by 16-bit parallel data word. In this way according to known techniques it is necessary to process a relatively long data word of a number of bits, and therefore the structure of a level adjusting circuit or equalizer has suffered from complex structure. Such complex structure results in high manufacturing cost, while it is difficult to construct a main portion of the equalizer by way of an integrated circuit.

SUMMARY OF THE INVENTION

The present invention has been developed in order to remove the above-described drawbacks inherent to the conventional circuit arrangement for correcting frequency response of an input audio signal.

It is, therefore, an object of the present invention to provide a new and useful circuit arrangement which comprises a frequency response control circuit or an automatic graphic equalizer with a simple structure which is readily constructed as an integrated circuit at a low cost.

According to a feature of the present invention, an automatic frequency response control circuit or a graphic equalizer is digitally controlled by output data from a microcomputer such that a desired frequency response is given to an input audio signal by finding the difference between a desired frequency response curve and a frequency response curve obtained as the result of measurement of sound pressure level at various frequencies in a sound field to which a reference noise signal is emitted, and the frequency response control circuit of the type using an amplifier and a plurality of resonance circuits corresponding to various bands, comprises an interface of a particular structure so as to receive serial data fed from the microcomputer and to decode the same for controlling a plurality of analog switches included in each of a plurality of variable resistor circuits which also have a particular structure.

According to another feature of the present invention, the frequency response control circuit can be readily manufactured at a low cost as an integrated circuit due to its simple structure.

According to a further feature of the present invention, various frequency response curve data, which are manually inputted in correspondence with respective music pieces in accordance with user's liking, can be written on an external storage medium in which various pieces of music are also recorded such that each piece of music is accompanied by each frequency response curve datum. Therefore, once a desired frequency response suitable for a particular piece of music is determined and written, the music piece can be listened to with the desired frequency response whenever the music is played back.

In accordance with the present invention, there is provided a circuit arrangement for automatically giving a frequency response to an input audio signal, comprising: (a) a reference signal generator for producing a reference audio signal; (b) a selector for selecting said reference audio signal or said input audio signal from a signal source, said selector being controlled such that said reference audio signal is selected until a desired frequency response is given thereto; (c) a frequency response control circuit responsive to a control signal for giving a given frequency response to an audio signal from said selector such that the level of said audio signal is controlled at n bands wherein n is a positive integer, said frequency response control circuit including: an amplifier responsive to said audio signal from said selector, said amplifier having a negative feedback path; a plurality of variable resistor circuits whose number is 2n, each of said variable resistor circuits having a parallel circuit of a plurality of series circuits of a resistor and an analog switch, a first group of n of said variable resistor circuits being connected to said negative feedback path to cause a loop gain of said amplifier to increase, and a second group of n of said variable resistor circuits being connected to said amplifier to cause the attenuation of the level of said audio signal; a plurality of resonance circuits whose number is n, having different center frequencies within an audio frequency range, each of said resonance circuits being connected to two of said variable resistor circuits respectively belonging to said first and second groups; an interface circuit responsive to said control signal for controlling on-off operation of said analog switches of said variable resistor circuits, said interface circuit having a shift register of serial-in, parallel-out type for receiving said control signal by shifting serial data in response to a clock pulse signal, a decoder responsive to some bits of parallel outputs from said shift register for producing a latching pulse to select one of said n bands, n latches arranged to be enabled by said latching pulse so that one of said n latches is used to store some of said bits of the parallel outputs from said shift register so as to control on-off operations of said analog switches of one of said variable resistor circuits corresponding to a designated band, and first means responsive to a timing signal and to one of said parallel outputs from said shift register for causing said decoder to output said latching pulse; (d) a power amplifier responsive to an output signal from said frequency response control circuit for driving a loud speaker so that said audio signal passed through said frequency response control circuit is emitted to a sound field; (e) second means responsive to an output signal from a microphone located in said sound field for picking up said audio signal, for analyzing frequency response at said n bands and for producing digital data indicative of a signal level at each of said n bands; (f) storage means for storing digital data indicative of a plurality of frequency response curves; and (g) computing means responsive to said digital data from said second means and to said digital data from said storage means; for computing the difference in signal level between said two digital data at each of said bands; for producing said control signal by using the difference between said two digital data, said control signal including a first digital data word including information for designating one of said bands, and a second digital data word including information for designating signal level in each of said bands, said first and second digital data words having a serial format so that said first and second digital data words are fed to said interface circuit of said frequency response control circuit via a single line, said first and second digital data words including one bit indicating that the digital data word is either said first or second digital data word; and for producing said timing signal which will be used by said interface circuit for detecting said one bit for distinguishing said first digital data word from said second digital data word.

BRIEF DESCRIPTION OF THE DRAWINGS

The object and features of the present invention will become more readily apparent from the following detailed description of the preferred embodiments taken in conjunction with the accompanying drawings in which.

The same or corresponding elements and parts are designated at like reference numerals throughout the drawings.

DETAILED DESCRIPTION OF THE INVENTION

Figure 1:
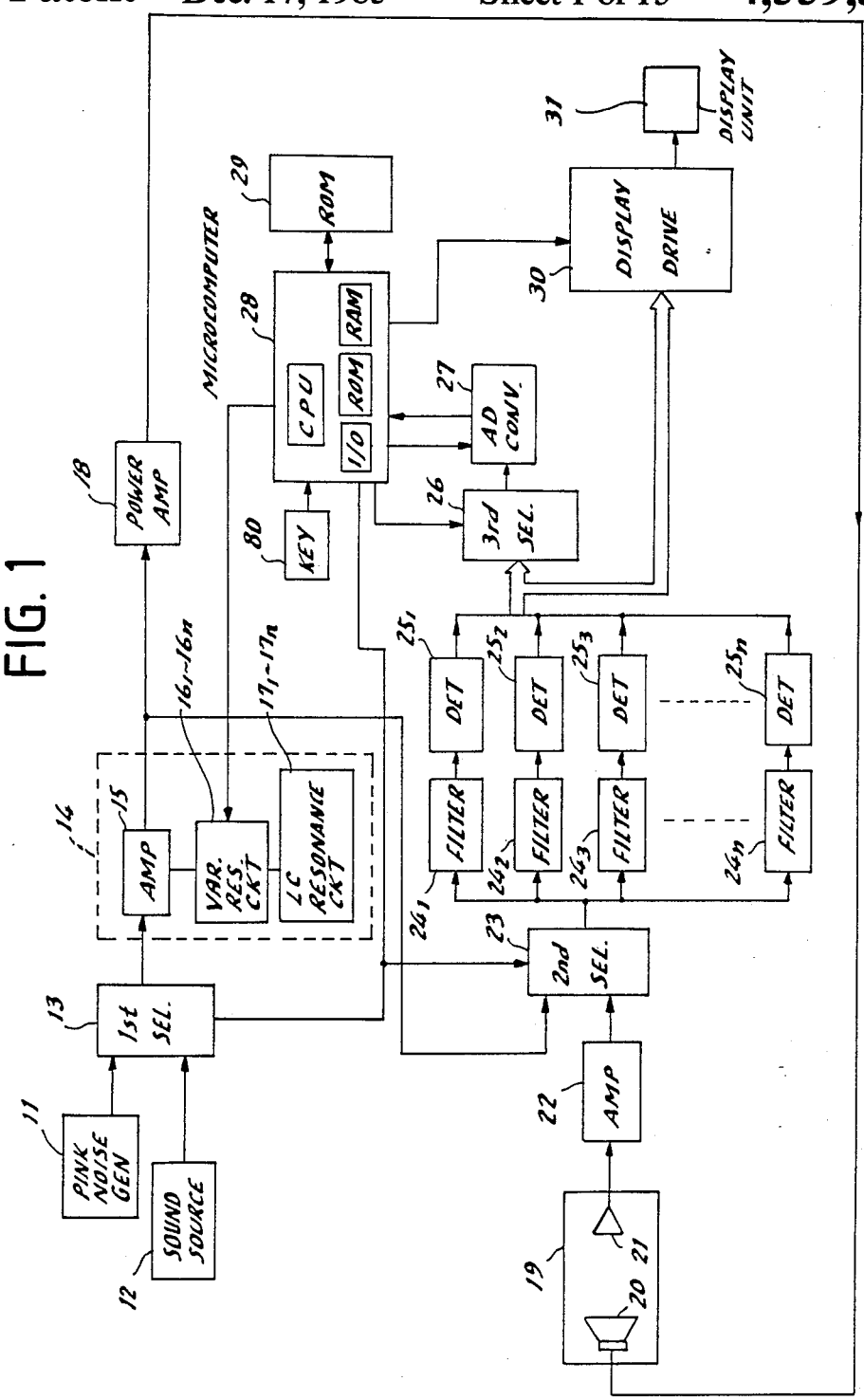
FIG. 1 is a schematic block diagram of the circuit arrangement according to the present invention.

Referring now to FIG. 1, a schematic block diagram of an embodiment of the circuit arrangement according to the present invention is shown. The circuit arrangement comprises a reference noise source 11, such as a pink noise generator, a first selector 13 for selecting either pink noise from the pink noise generator 11 or an audio signal from a sound source 12, such as a radio, tape recorder or the like. The first selector 13 as well as other selectors, which will be described hereinafter, may be analog multiplexer which is controlled by a selection signal from a microcomputer. An output signal from the first selector 13 is fed to a frequency response control circuit 14, which functions as an automatic graphic equalizer, so that a desired frequency response is given to the signal. The frequency response control circuit 14 comprises an amplifier 15, a plurality of variable resistor networks or circuits $16_1$ to $16_n$, and a plurality of resonance circuits $17_1$ to $17_n$, wherein "n" is a positive integer corresponding to the number of frequency bands at which an input audio signal is to be controlled, and "n" will be used to indicate the band number throughout the specification. An output signal from the frequency response control circuit 14 is amplified by a power amplifier 18 which drives a loud speaker 20. Thus an audio signal is emitted from the speaker 20 to a sound field 19 in which a calibrated microphone 21 is placed to pick up sound in the sound field 19, detecting the sound pressure level at the location of the microphone 21. An audio signal from the microphone 21 is amplified by a variable-gain amplifier 22 to be fed to a plurality of filter circuits $24_1$ to $24_n$ via a second selector 23. These filters $24_1$ to $24_n$ are band pass filters having different pass bands so that an entire audio signal frequency range is divided into a plurality of frequency bands f1, f2, . . . fn, such as 12 bands whose center frequencies are for instance 16 Hz to 32 kHz. Each filter circuit $24_1$ . . . $24_n$ is followed by a detector $25_1$ to $25_n$, and output signals from these detectors $25_1$ to $25_n$ are fed to an AD converter 27 via a third selector 26 which selectively supplies the AD converter 27 with each output signal from the plurality of detectors $25_1$ to $25_n$. AD converted signal from the AD converter 27 is fed to a control unit 28, such as a microcomputer, to detect the frequency response of the sound field 19 and to control the frequency response control circuit 14 so that a desired frequency response is obtained.

Although the filter circuits $24_1$ to $24_n$ and detectors $25_1$ to $25_n$ as well as the AD converter 27 are employed for effecting frequency or spectrum analysis in the illustrated embodiment, such frequency analysis may also be effected by Fast Fourier Transform which can be executed by the microcomputer 27.

The microcomputer 28 comprises a CPU (central processing unit), a ROM (read-only memory), a RAM (random-access memory), an I/O (input-output) port, and a timer. The microcomputer controls not only the frequency response control circuit 14 but also the above-mentioned first to third selectors 13, 23 and 26 so that a desired signal is respectively selected therein. Furthermore, the AD converter 27 is also controlled by the microcomputer 28. Instructions for operating a predetermined program are prestored in the ROM so that the CPU operates accordingly. In addition data indicative of a plurality of frequency responses is prestored in the ROM of the microcomputer or in an additionally provided ROM 29 so that a desired one may be selected in accordance with a signal from a manually operable switch or a keyboard 80. These ROMs will be simply referred to as ROM without distingushment therebetween since their operation is identical.

A display unit 31 and a display drive/control circuit 30 are provided for visually indicating a frequency response curve by reading one of prestored curve data or by analyzing the spectrum of an input audio signal as will be described hereinafter. The display control circuit 30 is responsive to the output signals from the detectors $25_1$ . . . $25_n$ for controlling the display unit 31 where the display control circuit 30 is controlled by a signal from the microcomputer 28.

Figure 2:
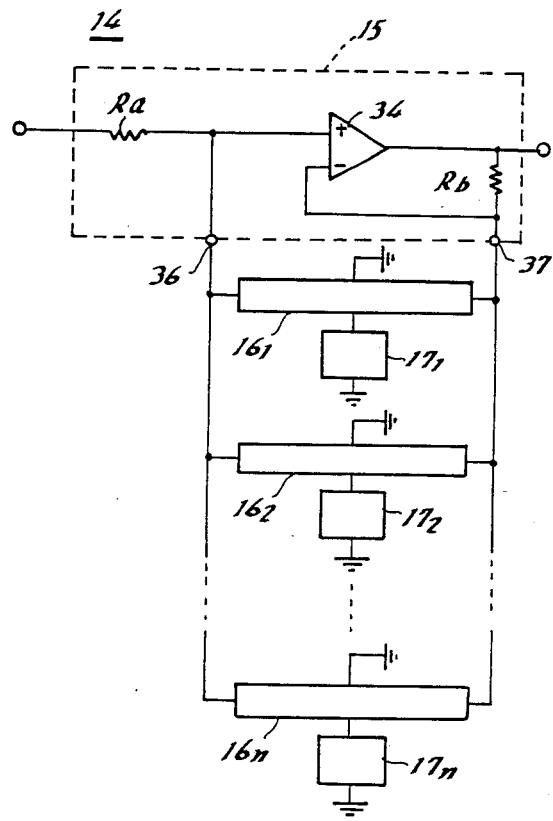
FIG. 2 is a schematic diagram of an embodiment of the frequency response control circuit shown in FIG. 1.

FIG. 2 shows the frequency response control circuit 14 of FIG. 1. The amplifier 15 of the frequency response control circuit 14 of FIG. 1 comprises an input resistor Ra, an operational amplifier 34, and a feedback resistor Rb. The plurality of variable resistor networks $16_1$ to $16_n$ and the plurality of LC resonance circuits $17_1$ to $17_n$ are connected to the operational amplifier as shown such that n pairs of the variable resistor network and the LC resonance circuit are provided for covering n bands. The variable resistor network $16_i$ associated with a corresponding LC resonance circuit $17_i$ has a structure as shown in detail in FIG. 3. Namely, each variable resistor network $16_i$ (wherein "i" is a postive integer indicating any of 1 through n) comprises a plurality of resistors R1, R2, . . . R2m−1, R2m which are connected in series between noninverting input (+) and an inverting input (−) of the operational amplifier 34 via terminals 36 and 37, and a plurality of switches S1, S2, . . . S2m−1, S2m respectively connected between a terminal 39 and one end of respective resistors R1 . . . R2m to constitute a ladder structure as shown. The terminal 39 is connected to an input terminal of the LC resonance circuit $17_i$.

A terminal 38 connected to a junction between resistors Rm and Rm+1 is grounded, functioning as a center tap. Therefore, the combination of the resistors R1 . . . R2m and the switches S1 . . . S2m functions as a variable resistor having two end terminals 36 and 37, a center tap 38, and a movable contact terminal 39.

Each variable resistor network $16_i$ causes the operational amplifier 34 to either decrease or increase gain with respect to an input signal of a narrow band defined by an associated LC resonance circuit $17_i$ where a center frequency of the narrow band equals the resonating frequency of the LC resonance circuit $17_i$. The plurality of switches S1 . . . S2m are arranged such that only one of them is selectively closed while remaining switches remain open. When the switch S0 connected to ground via the terminal 38 is closed, the gain of a loop of the operational amplifier 34 with respect to the narrow band defined by the associated resonance circuit $17_i$, is set to predetermined value. When one of left half switches S1 . . . Sm positioned close to the terminal 36 is closed, the gain is lowered such that the degree of attenuation increases as a switch closer to the terminal 36 is closed. On the other hand, when one of right half switches Sm+1 to S2m positioned close to the terminal 37 is closed, the gain is raised such that the gain increases as a switch closer to the terminal 37 is closed.

When it is intended to determine and correct the frequency response, the pink noise from the pink noise generator 11 is selected by the first selector 13 to be applied to the frequency response control circuit 14. Assuming that a given frequency response is given to the pink noise by the frequency response control circuit 14 so that such pink noise is emitted from the speaker 20 to the sound field, the frequency response is changed by a frequency response determined by an acoustic characteristic inherent to the sound field 19. As a result, such a changed or modified frequency response will be detected by picking up the sound in the sound field by way of the microphone 21. The changed frequency response is then compared with one of a plurality of predetermined frequency response curves selected from the ROM to find the difference therebetween. This difference, i.e. difference in decibel at each band, is then used to produce a control signal which is in turn fed to the frequency response control circuit 14 to suitably select one of the switches S1 . . . S2m in each variable resistor network $16_i$. Therefore, the loop gain of the operational amplifier 34 at respective bands is optimally controlled so as to obtain a desired frequency response. After the frequency response control circuit 14 has been desirably controlled, the first selector 13 is switched to select an input audio signal. Therefore, the input audio signal from the sound source 12 is given to the sound field 19 with a desired frequency response being given thereto.

The second selector 23 is normally set so that the output signal from the variable gain amplifier 22 is fed to the plurality of filter circuits $24_1$ to $24_n$. When it is intended to display the frequency response given to the input signal by the frequency response control circuit 14, the second selector 23 is controlled to select the output signal from the frequency response control circuit 14 as will be described hereinafter.

The detector $25_i$ each responsive to a corresponding filter circuit $25_i$ produces a DC voltage signal indicative of the amplitude or level at each band.

The third selector 26 is arranged to select the plurality of output signals from the plurality of detectors $25_1$ to $25_n$ in sequence such that each output is cyclically fed to the AD converter 27.

Figure 4:
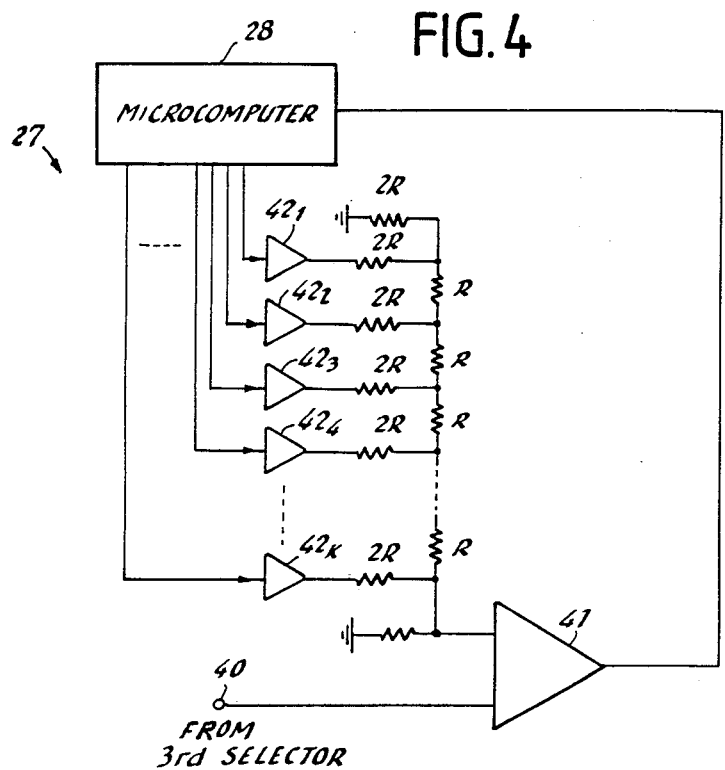
FIG. 4. is a schematic diagram of the AD converter shown in FIG. 1.

FIG. 4 shows a circuit diagram of the AD converter 27 of FIG. 1. Although any of well known AD converters may be used as the AD converter 27, the AD converter shown in FIG. 4 is actualized by the combination of the microcomputer 28 and a circuitry having a plurality of buffer amplifiers $42_1$ to $42_k$ where "k" is a positive integer, a resistor ladder network having horizontal resistors, whose resistance is 2R, and vertical resistors, whose resistance is R, and a comparator 41. The buffer amplifiers $42_1$ to $42_k$ and the resistors constitute a known DA converter responsive to digital data from the microcomputer 28. This DA converter produces an analog voltage rising in steps, which voltage is applied to an input terminal of the comparator 41 having another input terminal for receiving the output signal from the third selector 26 via a terminal 40. To this end the microcomputer 28 is arranged to output digital data indicative of a voltage which increases in steps by a predetermined value. Namely, as will be described hereinafter a software counter within the CPU is arranged to increase its count at a predetermined interval to produce such digital data varying in sequence. Thus the comparator 41 compares the level of the signal from the third selector 26 with the step varying voltage from the ladder network DA converter such that an output signal of a predetermined polarity is produced at its output at a timing defined by the level of the signal from the third selector 26. This output signal is fed to the microcomputer 28 so that the instance where the level of the signal from the third selector 26 equals the voltage from the DA converter is detected by counting the number of clock pulses between a reference timing and the appearance of the output signal from the comparator 41. As a result, the voltage from the detector $25_i$ is converted into digital data. The above operation is effected with respect to each band so that digital data indicative of the level of the sound in the sound field 19 is obtained to determine the acoustic characterstic or frequency response of the sound field 19.

Figure 5:
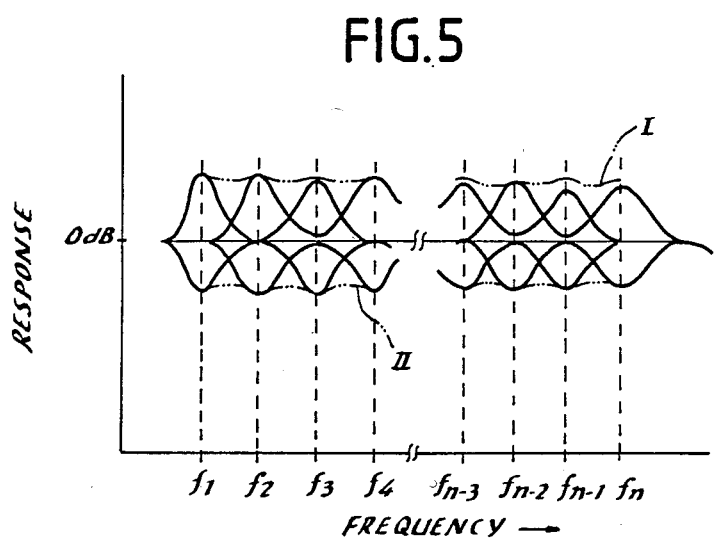
FIG. 5 is an explanatory diagram showing the range of frequency response control effected by the arrangement of FIG. 1.

FIG. 5 is an explanatory diagram showing a level range which can be controlled or corrected by the circuit arrangement according to the present invention. The references f1, f2 . . . fn indicate center frequencies of the plurality of bands, such as 16 Hz, 31.5 Hz, 63 Hz . . . 16 kHz, and 32 kHz, where level control, namely boosting or attenuation is effected. A frequency response curve I shows a state in which maximum boosting amount, i.e. level increasing amount, is given to an input signal throughout the entire audio frequency range, while another frequency response curve II shows a state in which maximum attenuating amount, i.e. level decreasing amount, is given to the same. Therefore, it is possible to give any desired frequency response curve to an input audio signal within the level range defined by the two curves I and II.

Figure 6A:
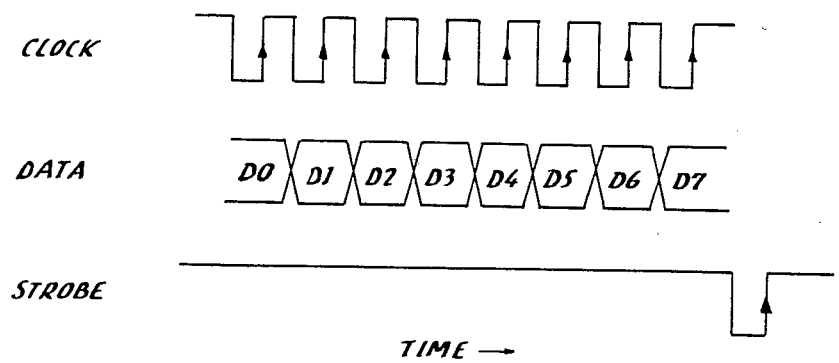
FIG. 6A is a timing chart showing three output signals fed from the microcomputer to the frequency response control circuit both shown in FIG. 1.

FIG. 6A shows a time chart of signals fed from the microcomputer 28 to the frequency response control circuit 14 of FIG. 1. Although FIG. 1 shows only a single line connected between the microcomputer 28 and the frequency response control circuit 14 for simplicity, there are three lines for sending a clock pulse signal, a data signal, and a strobe signal. The data signal includes first and second data words of serial bits as will be described in detail hereinafter.

Figure 6B:
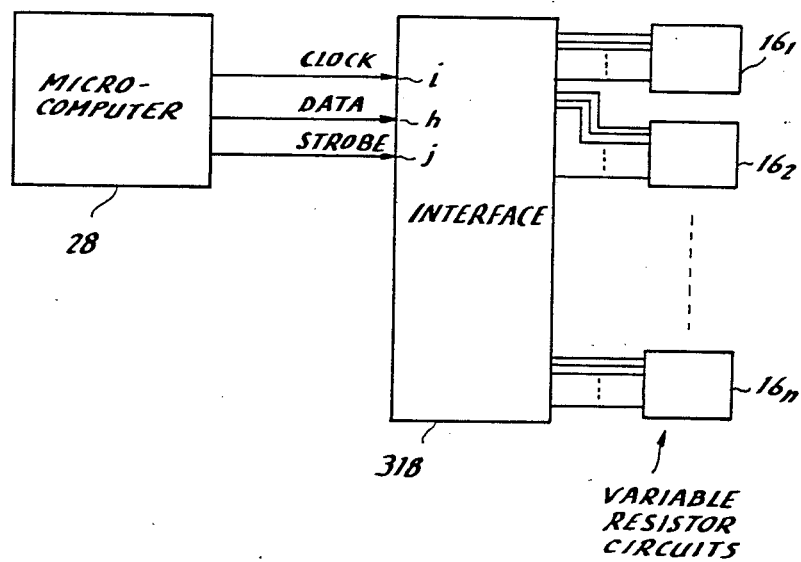
FIG. 6B is a schematic diagram showing the relationship between the microcomputer and the frequency response control circuit both shown in FIG. 1.

FIG. 6B shows the relationship between the microcomputer 28 and the frequency response control circuit 14 which actually comprises an interface 318 responsive to the above-mentioned three sorts of signals. The amplifier 15 and the LC resonance circuits $17_1$ to $17_n$ of FIG. 1 are not shown in FIG. 6B for simplicity. The interface 318 is used to decode serially fed data from the microcomputer 28 so that one of n variable resistor circuits $16_1$ to $16_n$ is controlled at one time. Detailed structure and operation of the interface 318 and variable resistor circuits $16_1$ to $16_n$ controlled by the interface 318 will be described hereinafter.

Figure 7A:
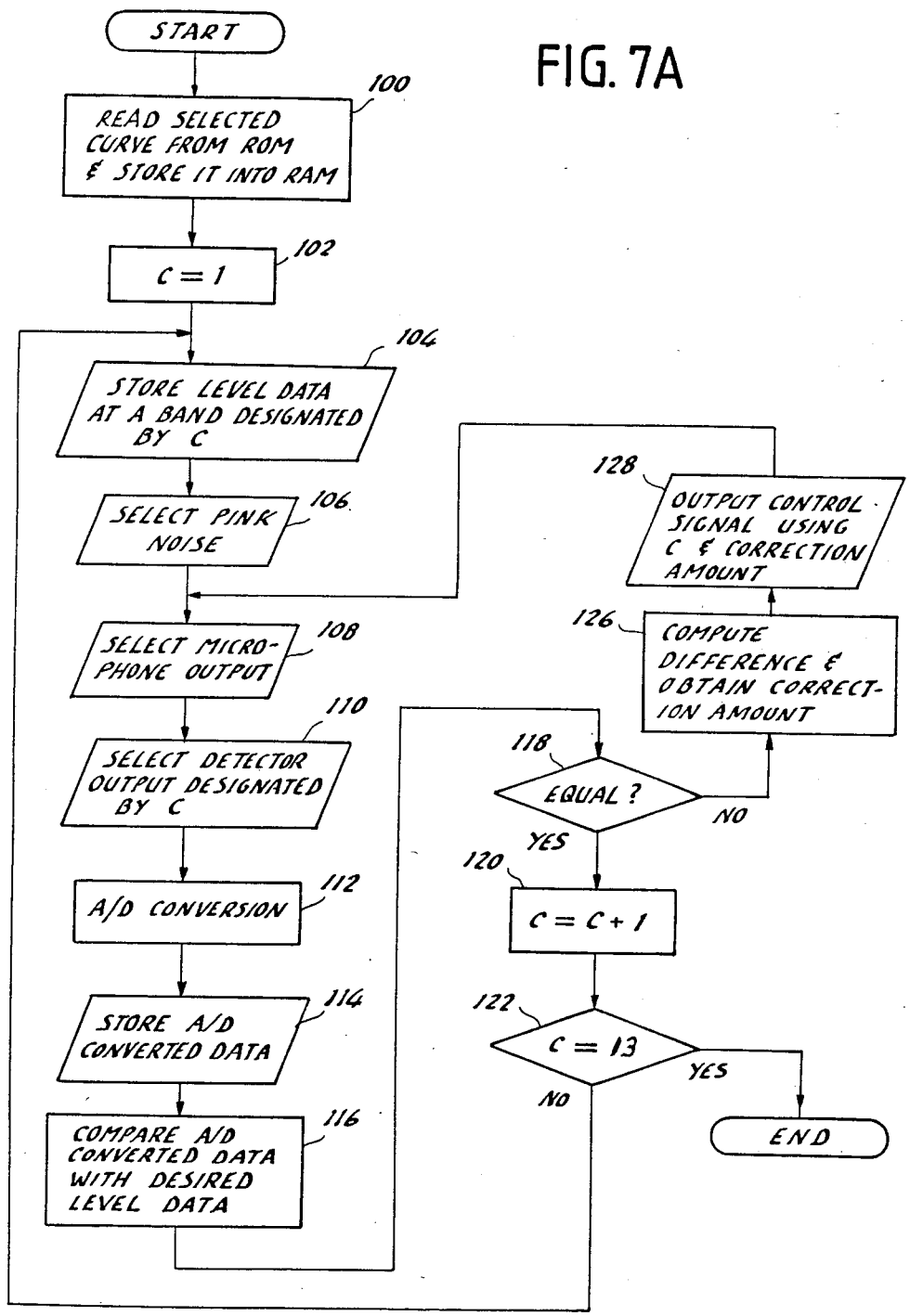
FIGS. 7A and 7B are flowcharts showing an example of the operation of the microcomputer shown in FIG. 1.

The operation of the microcomputer 28 will be described in further detail with reference to flowcharts of FIGS. 7A and 7B. Referring first to FIG. 7A after power is supplied to the microcomputer 28, necessary initialization is effected. Then in a step 100, a desired frequency response curve, such as a flat curve, is stored in the RAM by reading out one of predetermined frequency response curves prestored in the ROM in accordance with instructions manually inputted by way of the key 80 (see FIGS. 1 and 9). In a following step 102, a count C of a software counter is set to 1. This count C is used to designate one of the bands f1 to fn, and therefore, the lowest frequency band, whose center frequency is 16 Hz in this embodiment, is designated when the count C is 1. Then in a step 104, data indicative of frequency response or signal level at a designated band is stored in the RAM by using the count C. Namely, when the count C is 1, frequency response or level in dB at the lowest frequency band (f1=16 Hz) is stored. Then in a step 106, the first selector 13 is controlled so that the pink noise is selected, and in a step 108 the second selector 23 is controlled so that the output signal from the microphone 21 is fed via the variable gain circuit 22 to the filter circuits $24_1$ to $24_n$. Then in a step 110, the third selector 26 is controlled so that the output signal from one of the detectors $25_1$ to $25_n$ is selected by using the above-mentioned count C. Namely, in the case that the count C is 1, the output signal from the detector $25_1$, indicative of the level of the lowest frequency band f1 is selected and fed to the AD converter 27. In a step 112, AD conversion is effected, and digital data resulted from the AD conversion is stored in a predetermined address of the RAM in a step 114. Then in a step 116, digital data indicative of the measured signal level at the selected band is compared with digital data representing signal level constituting the desired frequency response curve, and it is subsequently determined whether they are equal to each other or not in a step 118.

If the result of the step 118 is YES, namely, when the level at the selected band is equal to the level of the desired frequency response, there is no need to adjust the gain of the amplifier 15 of the frequency response control circuit 14. Therefore, the count C is increased by 1 to perform operations similar to the above in connection with a next band in a step 120. On the other hand, if the determination in the step 118 is NO, namely if there is a difference between the desired frequency response or level and the measured level, a step 126 is executed to obtain the difference, and a value or amount of necessary correction is computed.

Once amount of correction to be made is determined, the microcomputer 28 produces, in a step 128, an output signal which controls the frequency response control circuit 14 so that the frequency response at the selected band is adjusted as will be described in detail with reference to another flowchart of FIG. 7B hereinafter. After the completion of the step 128, the operational flow goes to the step 108 to repeat similar operations. A step 122 is executed after the step 120 to see whether the count C equals 13 or not since the embodiment circuitry is of 12 band system. If the determination in the step 122 is NO, namely if the count C is smaller than 13, a desired frequency response data at a next band is stored in the RAM in the step 104. After this, the above-described steps are repeatedly executed until the count C reaches 13. When the count C equals 13, the routine of FIG. 7A is terminated.

Figure 7B:
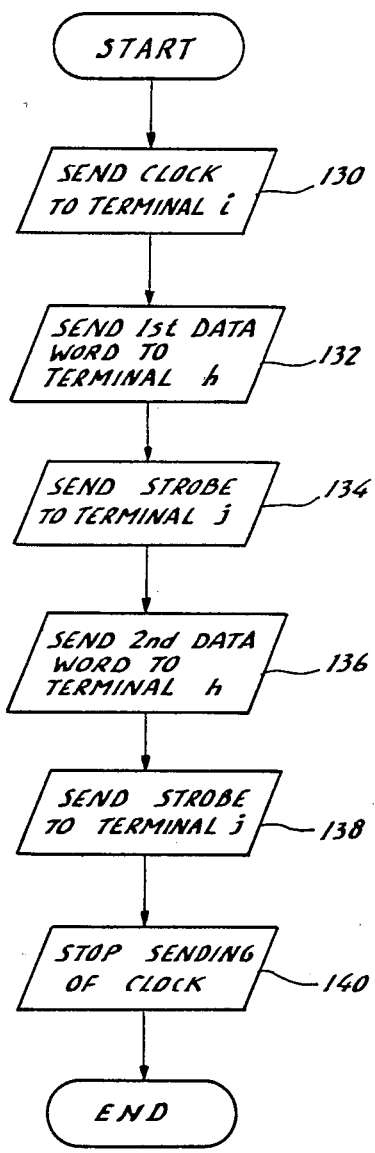

FIG. 7B shows a detailed flow chart of the step 128 of FIG. 7A. At first in a step 130, the clock signal is sent to the frequency response control circuit 14 such that the clock signal is fed to the terminal i (see FIGS. 6B and 14). In a step 132, a first data word including band-designation data is fed to the terminal h, and then in a step 134 the strobe signal is fed to the terminal j. Then in a step 136, a second data word including level data indicative of the amount of correction to be made is fed to the terminal h, and subsequently in a step 138 another strobe signal is fed to the terminal j. Then in a step 140, sending of the clock pulse signal to the frequency response control circuit 14 is terminated. These signals fed to the terminals h, i and j of the frequency response control circuit 14 will be used so that signal level is controlled at each band as will be described in detail hereinafter with reference to FIGS. 14, 15 and 16.

In the above-described embodiment although one of a plurality of predetermined frequency response curves is read out from the ROM to be compared with the AD converted data so as to control the frequency response in a desired manner, the frequency response desired to be given to the audio signal may be manually controlled if a manually operable frequency response setting device is provided.

Figure 8:
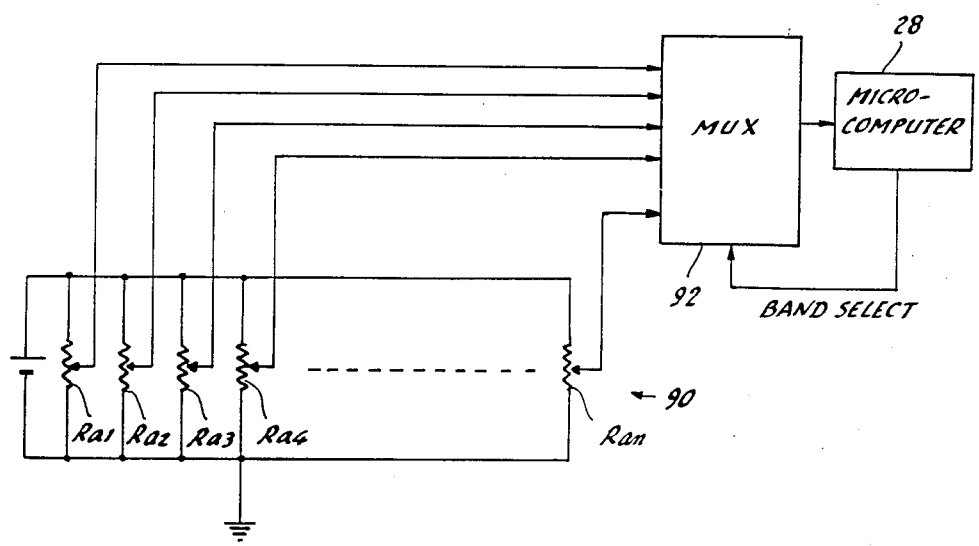
FIG. 8 is a schematic diagram showing a circuit for manually inputting a desired frequency response curve to the microcomputer of FIG. 1.

Hence, reference is now made to FIG. 8 showing a circuit which is capable of giving a frequency response in a desired manner in accordance with instructions from a user. In FIG. 8 the reference 90 is an array of a plurality of variable resistors Ra1 to Ran which are manually operable for inputting any desired frequency response curve. Therefore, the user may manipulate knobs of the variable resistors Ra1 to Ran so as to set a desired frequency curve in the same manner as in the case of conventional graphic equalizer. Each variable resistor Rai is supplied with a predetermined DC voltage so that an output voltage from each variable resistor Rai varies depending on the position of its movable contact. Voltages from these variable resistors are fed to the microcomputer 28 via a multiplexer 92 controlled by the microcomputer 28, to be converted into digital data first and are then written into the RAM. As a result, the frequency response data manually inputted via the variable resistors Ra1 to Ran are used to be compared with AD converted data from the AD converter 27.

Therefore, when it is intended to use and set a frequency response curve, which is other than those prestored in the ROM, the above-mentioned variable resistors Ra1 to Ran are used. In the case that it is desired to use one of the frequency response curves prestored in the ROM again after a manually set frequency response curve has been used, the key 80 may also be used (see FIG. 1). A frequency response curve set in any of these ways may be visually displayed at the display unit 31 as described in the above so that the user can recognize which frequency response curve is being used.

Figure 9:
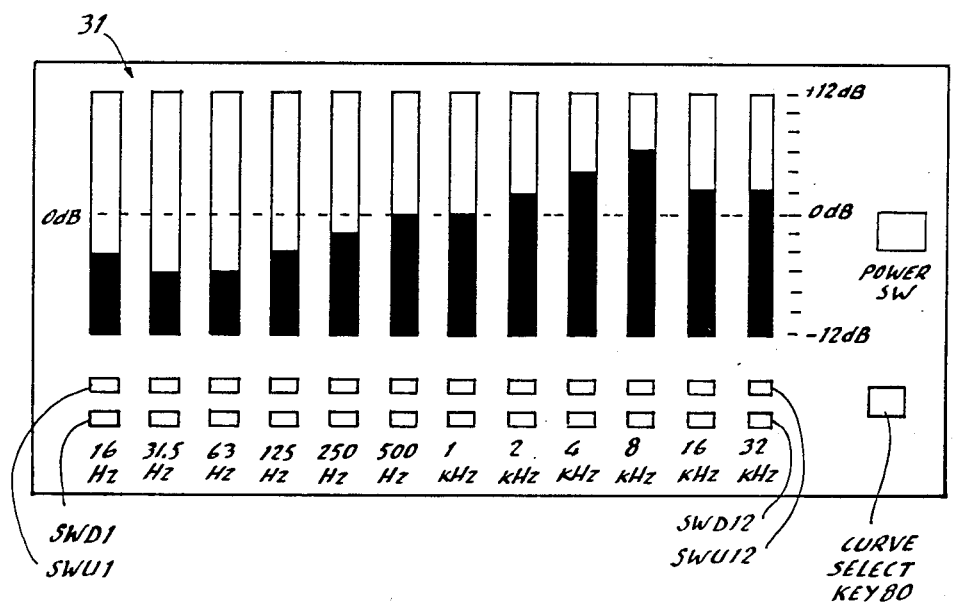
FIG. 9 is a view of a front panel of an automatic frequency response control system, to which the present invention is adapted, having a spectrum display unit and manual boost/attenuate buttons respectively provided for all the frequency bands.

FIG. 9 shows a front panel of a frequency response correcting device made in accordance with the present invention. Although in FIG. 8 a plurality of variable resistors Ra1 to Ran are used to manually input a desired frequency response curve which is to be given to an input audio signal, such plurality of variable resistors may be replaced with a plurality of switches and a software of the microcomputer 28. Namely, a pair of switches SWUi and SWDi is provided for each band as shown in FIG. 9 so that signal level at each band is either raised (boosted) or lowered (attenuated) in steps by depressing these switches such that the microcomputer 28 detects the number of times or time length of depressing these switches SWUi and SWDi. Each of the switches SWU1 to SWU12 is used for increasing the signal level, while each of the switches SWD1 to SWD12 is used for decreasing the same. Namely, the microcomputer 28 is so programmed that the signal level in dB in each band is either increased or decreased depending on the number of times or time length of depressing the switches SWUi and SWDi.

The reference 31 in FIG. 9 indicates a front portion of the display unit 31 of FIG. 1. The display unit 31 comprises n sections each corresponding to n bands, i.e. 12 bands in the illustrated example. Each section comprises a plurality of light-emitting elements such as VFDs or LEDs arranged to be driven by the display drive/control circuit 30. In FIG. 9 energized light-emitting elements are shown by black bars. The plurality of light-emitting elements constituting each section are arranged vertically so as to provide a bar-graph type display which is used to show either a frequency response control curve desired to be given to an input signal, or a frequency response curve of an input audio signal. In other words, when the second selector 23 of FIG. 1 is controlled to select the output signal from the frequency response control circuit 14 or the output signal from the first selector 13, the spectrum of the input audio signal can be visually displayed by the display unit 31. Therefore, the circuit arrangement of FIG. 1 may also be used as a spectrum analyzer which visually exhibits signal levels at various frequency bands f1 to fn. When it is intended to manually input a desired frequency curve as described in the above by way of the buttons SWU1 to SWU12 and SWD1 to SWD12, the display unit 31 may be used as a level indicator at each band so that accurate input can be effected.

Although the level increase/decrease switches and the display unit 31 of FIG. 9 are shown to be used for only a single channel of an audio signal, the arrangement of FIG. 9 can be doubled so that both left and right channel signals of a stereo system can be processed simultaneously.

In the above-described embodiments although some predetermined frequency response curve data are prestored in the ROM, such data may be derived from an external storage device, such as magnetic recording tape, floppy disc or the like.

Figure 10:
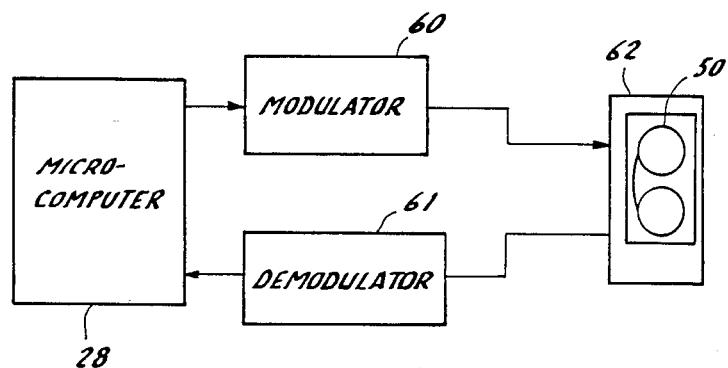
FIG. 10 shows partially another embodiment of the circuit arrangement according to the present invention, in which embodiment frequency response curve data is magnetically stored.

FIG. 10 shows another embodiment in which such frequency response data is arranged to be read out from a magnetic recording tape by way of a tape recorder. Furthermore, a desired frequency response manually set to the circuit arrangement may be stored in the magnetic tape. In the system of FIG. 10, a modulator or a coder 60 and a demodulator or a decoder 61 are employed so as to record and reproduce digital data on and from a magnetic tape 50 within a tape recorder 62, such as a cassette tape recorder. FIG. 10 only shows a part of the embodiment which is different from the embodiment of FIG. 1.

Figure 11:
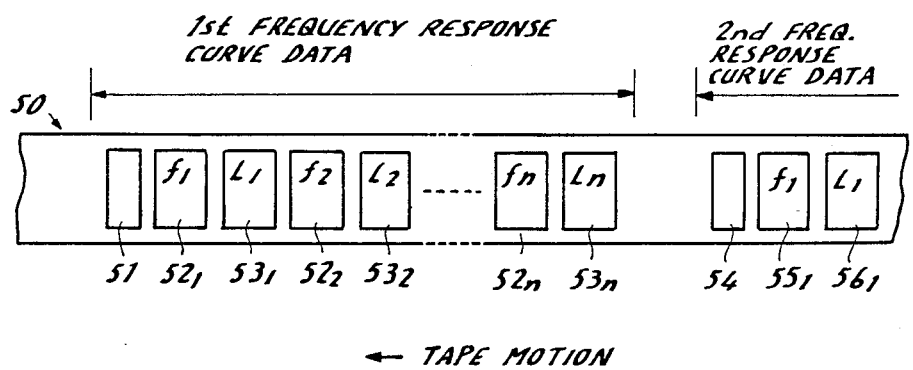
FIG. 11 is a schematic view showing data written on a magnetic recording tape used in the embodiment of FIG. 10.

In order that the magnetic tape functions in the same manner as the above-mentioned ROM, some of predetermined frequency response curve data are prestored in the magnetic tape 50 as shown in FIG. 11. Namely, assuming that the magnetic tape 50 travels in a direction indicated by an arrow, a first frequency response curve data is stored such that an information head signal, such as a framing code, is written on a portion 51, and a plurality of codes each indicative of each band and a plurality of codes each indicative of level in dB at each band are alternately written on respective sections $52_1 \ldots 52_n$ and L1 ... Ln. In this way second, third ... frequency response curve data are prerecorded in sequence on the magnetic tape 50. In FIG. 11, the references 54, $55_1$ and $56_1$ are second frequency response curve data portions respectively corresponding to portions 51, $52_1$ and $53_1$ for the first frequency response curve data, where the references f1, f2 ... fn indicate band-designation data and the references L1, L2 ... Ln indicate level data for each band. In this way, a plurality of frequency response curve data of a predetermined format is prestored in the form suitable for magnetic recording/reproducing in sequence as time series.

When it is intended to give a predetermined frequency response to an input audio signal, one of the predetermined frequency response curve data is read out from the magnetic tape 50 to be compared with the AD converted data from the AD converter 27. Remaining operation for giving such a frequency response to the input audio signal in this embodiment is the same as in the previous embodiments, and therefore repetitive description thereof is omitted.

In addition that the magnetic tape 50 is used in place of the ROM of FIG. 1, it can also be used as a permanent storage device for storing digital data relating to frequency response data representing a desired curve manually inputted by the variable resistors 90 of FIG. 8 or the switches SWD1 to SWD12 and SWU1 to SWU12 of FIG. 9. In order to write such data from the microcomputer 28, the data is first modulated in accordance with a predetermined modulating system in the modulator 60 so as to produce a signal suitable for magnetic recording. The modulator 60 includes a filter for limiting the frequency range of the modulated signal so that it is within an audio frequency range, and such a frequency-limited signal is fed to the tape recorder 62 to be written on the magnetic recording tape 50. Such frequency response data obtained by the microcomputer 28 may be written on an unused portion of the magnetic tape 50 or on a separate tape.

Figure 12:
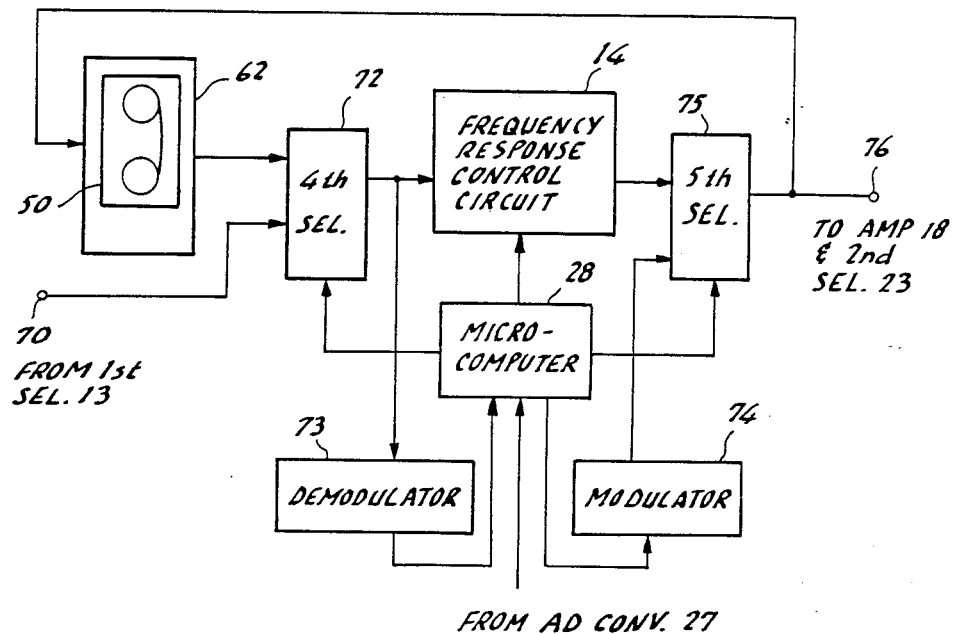
FIG. 12 shows partially further embodiment of the circuit arrangement according to the present invention, in which embodiment frequency response curve data as well as audio signals are magnetically stored so that each audio signal is accompanied by frequency response curve data.

Reference is now made to FIG. 12, which shows another embodiment of the present invention. The circuitry shown in FIG. 12 may be used in place of the combination of the frequency response control circuit 14 and the computer 28 of FIG. 1 such that an input terminal 70 is used to receive the output signal from the first selector 13, while an output terminal 76 is connected to the input of the power amplifier 18 and the input of the second selector 23. The circuitry of FIG. 12 comprises a fourth selector 72, a fifth selector 75, a frequency response control circuit 14 and a microcomputer 28 the latter two having the same structure as that of FIG. 1, a demodulator 73 and a modulator 74 functioning in the same manner as in FIG. 10.

The embodiment of FIG. 12 operates as follows. When it is intended to determine the frequency response of the sound field 19 and to give a frequency response to the audio signal from the sound source 12 (see FIG. 1), one of predetermined frequency response curve data is read out from the magnetic recording tape 50 of the tape recorder 62 in the same manner as described in the above. Namely, the fourth selector 72 is controlled by the microcomputer 28 so as to select an output signal reproduced by the tape recorder 62, and this signal is fed via the demodulator 73 to the microcomputer 28. Then the fourth selector 72 is switched so as to select the output signal from the first selector 13 which is controlled to select the pink noise from the pink noise generator 11. At this time the microcomputer 28 is arranged not to receive the output signal from the demodulator 73. Thus the pink noise is fed to the frequency response control circuit 14 which is controlled by the microcomputer 28 in accordance with the frequency response curve data from the magnetic tape 50 so that a desired frequency response characteristic is given to the pink noise. The pink noise having such a frequency response is then fed from the frequency response control circuit 14 via the fifth selector 75 to the power amplifier 18 of FIG. 2. At this time the tape recorder 62 is prevented from operating either automatically by a control signal from the microcomputer 28 or manually. Therefore, the pink noise is emitted from the speaker 20 to the sound field 19, and thus the frequency response control circuit 14 is controlled by the output signal from the microcomputer 28 in the same manner as in previous embodiments so that necessary frequency response curve setting is effected in the same manner as in the previous embodiments.

After a desired frequency response curve is set in the frequency response control circuit 14, data indicative of the desired frequency response curve is sent from the microcomputer 28 to the modulator 74 to convert the data signal into a signal suitable for magnetic recording, and then an output signal from the modulator 74 is fed via the fifth selector 75 to the tape recorder 62 to be recorded or written on the magnetic tape. The digital data indicative of the desired frequency response curve may be written on the magnetic tape 50 in the same manner as shown in FIG. 11.

Figure 13:
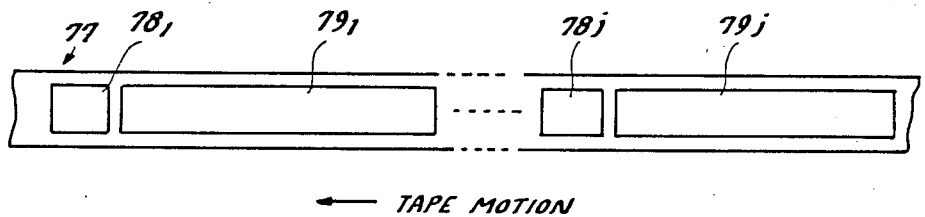
FIG. 13 is a schematic view showing data and audio signals alternately written on the magnetic tape used in the embodiment of FIG. 12.

Furthermore, the tape recorder 62 may be used for not only recording such digital data but also audio signals which are subjects of frequency response control. When it is intended to give a desired frequency response curve to a specific piece of music from the sound source 12, such as a record player, a desired frequency response curve is set manually in the same manner as described in the above by listening to played back music or the like. Then digital data indicative of such frequency response is first recorded on the magnetic tape 50. Then the frequency response control circuit 14 is reset so that a flat frequency response curve is achieved for recording the music from the sound source 12 without changing its frequency response on the magnetic tape 50. In this way a plurality of pieces of music may be recorded in sequence on the magnetic tape 50 such that each piece of music on the magnetic tape 50 is accompanied by corresponding digital data as shown in FIG. 13 where portions of digital data are indicated at the references $78_1$ and $78_j$, and music signal portions by $79_1$ and $79_j$. Therefore, it is possible to give different frequency response curves to respective pieces of music in accordance with user's liking.

Once desired frequency response curve suitable for each piece of music is determined and written on the magnetic tape as shown in FIG. 13, it is possible to automatically give the frequency response curve to the following piece of music whenever the magnetic tape 50 is played back since the digital data is first read out and is used to control the frequency response control circuit 14 in the same manner as described in the above. In order that the circuit arrangement of FIG. 12 operates in the above-mentioned manner, the fourth and fifth selectors 72 and 75 are controlled by selection-control signals from the microcomputer 28.

Figure 3:
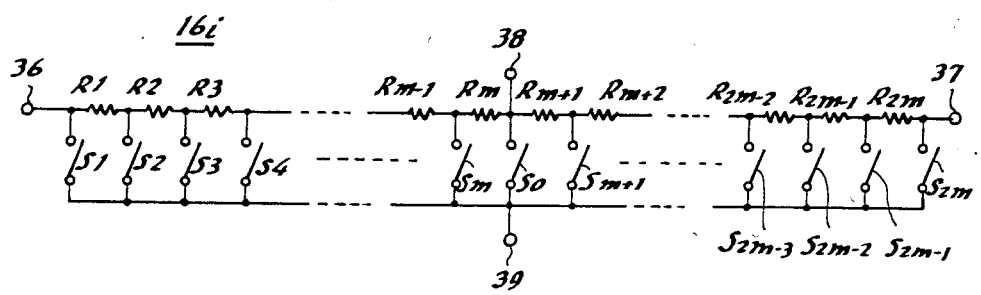
FIG. 3 is a diagram of one of the variable resistor networks or circuits shown in FIG. 2.
Figure 14:
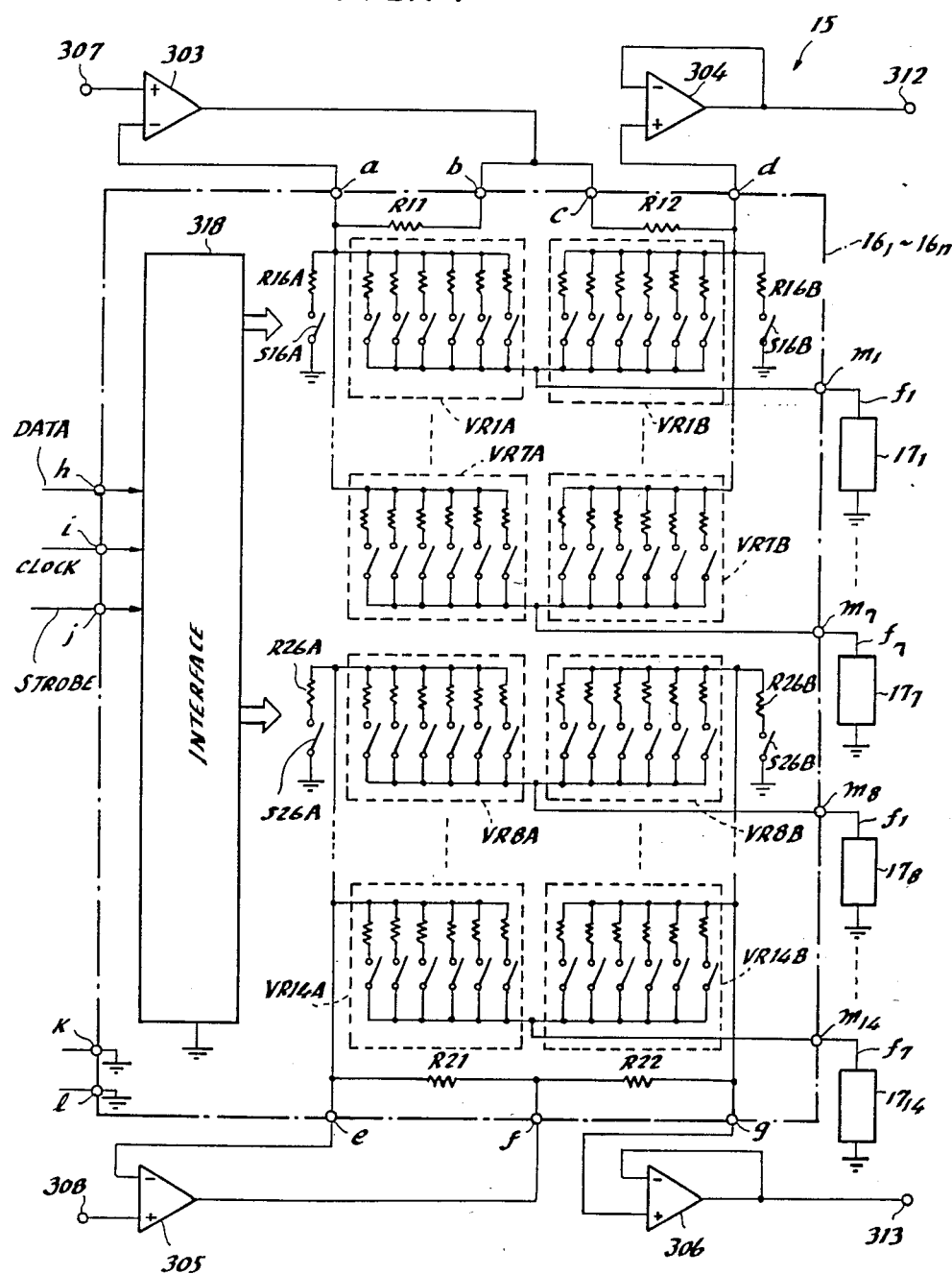
FIG. 14 is a schematic diagram of another example of the frequency response control circuit shown in FIG. 1.

Referring now to FIG. 14, a circuit diagram of the frequency response control circuit 14, whose structure is different from that of FIGS. 2 and 3, is shown. The frequency response control circuit 14 of FIG. 14 is arranged to process two different audio signals, such as first and second channel audio signals or left and right channel signals in a stereophonic system. Furthermore, the circuit arrangement of FIG. 14 comprises two operational amplifiers for each channel. Moreover, the arrangement of the plurality of resistors constituting variable resistor circuits $16_1$ to $16_n$ is different from that of FIG. 3.

Figure 15:
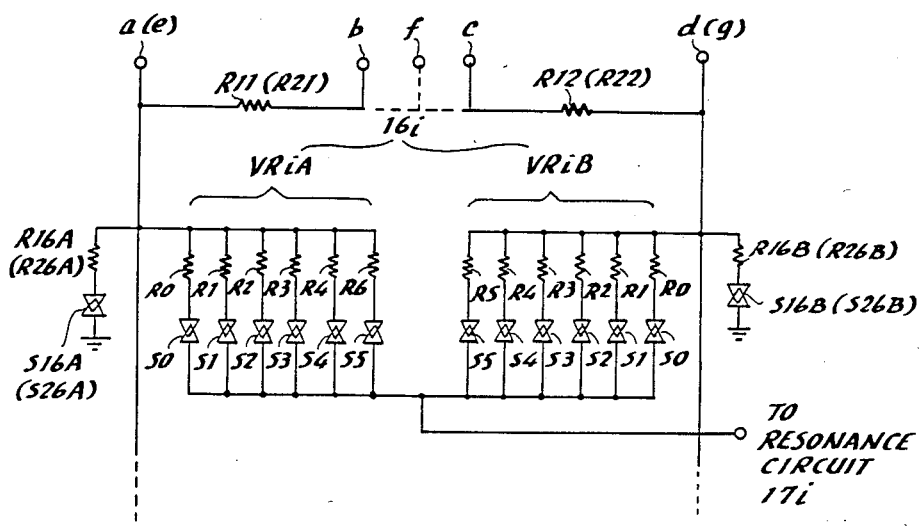
FIG. 15 is a diagram showing a portion of a plurality of variable resistor circuits shown in FIG. 14.

In FIG. 14, a portion enclosed by a dot-dash line includes the plurality of electronic variable resistor circuits VRiA and VRiB corresponding to those 16i of FIGS. 2 and 3, and an interface circuit 318 responsive to signals from the microcomputer 28, and these circuits enclosed by the dot-dash line may be constructed as an integrated circuit (IC). The references a, b, c, d, e, f, g, h, i, k, l and m1, m2 ... m14 are terminals of such an IC. The terminals h, i, j are used for receiving instructions from the microcomputer 28 as briefly described in the above with reference to FIG. 6B and the flowchart of FIG. 7B. The terminals k and l are ground terminals for digital data and analog signals. The illustrated frequency response control circuit 14 is designed such that the number of bands for each channel is 7, namely, n=7 where two sets of resonance circuits $17_1$ to $17_7$ and $17_8$ to $17_{14}$ are provided. To this end, the IC comprises the above-mentioned interface circuit 318, a first set of 14 variable resistor circuits VR1A ... VR14A, a second set of 14 variable resistor circuits VR1B ... VR14B, resistors R11, R12, R21, R22, R16A, R16B, R26A and R26B, and switches S16A, S16B, S26A and S26B. Each of the variable resistor circuits VR1A to VR14A and VR1B to VR14B comprises six resistors R0, R1 ... R5 having different values and six FET switches S0, S1 .. . S5 as shown in FIG. 15. Namely, each variable resistor circuit VRiA or VRiB comprises a parallel circuit of six series circuits of a resistor R0 (R1 ... R5) and a switch S0 (S1 ... S5) as clearly seen in FIG. 15. Since one or more of the six switches S0 to S5 which are normally open can be closed as will be described hereinafter, the resultant parallel resistance of each variable resistor circuit VRiA or VRiB can assume $2^6$ different values. A pair of variable resistor circuits VRiA and VRiB correspond to the variable resistor circuit 16i of FIG. 3. Namely, the pair of variable resistor circuits VRiA and VRiB are provided for each band. The resistor R11 is connected between the terminals a and b, while the resistor R12 is connected between the terminals c and d. Similarly the resistor R21 is connected between the terminals e and f, while the resistor R22 is connected between the terminals f and g.

Two pairs of operational amplifiers are connected to the IC such that an inverting input (−) of an operational amplifier 303 is connected to the terminal a; an output terminal of the operational amplifier 303 is connected to the terminals b and c; a noninverting input (+) of an operational amplifier 304 is connected to the terminal d; an inverting input (−) of an operational amplifier 308 is connected to the terminal e; an output terminal of the operational amplifier 308 is connected to the terminal f; a noninverting input (+) of an operational amplifier 306 is connected to the terminal g. Fourteen resonance circuits 17 to $17_{14}$ each of which may have the same structure as that used in the arrangement of FIG. 2, are respectively connected to terminals m1, m2 ... m14 of the IC so that each resonance circuit $17_i$ is connected to one end of two variable resistor circuits VRiA and VRiB.

The other end of each of the variable resistor circuits VR1A ... VR7A is connected to a series circuit of the resistor R16A and the switch S16A, while the other end of each of the variable resistor circuits VR1B ... VR7B is connected to a series circuit of the resistor R16B and the switch S16B. Similarly, the other end of each of the variable resister circuits VR8A ... VR14A is connected to a series circuit of the resistor R26A and the switch S26A, while the other end of each of the variable resistor circuits VR8B ... VR14B is connected to a series circuit of the resistor R26B and the switch S26B. One end of each of the series circuit of the resistor R16A (R16B, R26A, R26B) and the switch S16A (S16B, S26A, S26B) is grounded.

The above-mentioned other end of each of the variable resistor circuits VR1A to VR7A is connected via the terminal a to the noninverting input (−) of the operational amplifier 303, while the other end of each of the variable resistor circuits VR1B to VR7B is connected via the terminal d to the noninverting input (−) of the operational amplifier 304. Similarly, the other end of each of the variable resistor circuits VR8A to VR14A is connected via the terminal e to the noninverting input (−) of the operational amplifier 308, while the other end of each of the variable resistor circuits VR8B to VR14B is connected via the terminal g to the noninverting input (+) of the operational amplifier 306.

The above-mentioned switches S16A, S16B, S26A, S26B, and S0, S1 ... S5 in each variable resistor circuit VRiA (VRiB) are analog switches, such as FETs as shown in FIG. 15, and these analog switches are controlled by output signals from the interface circuit 318 so that each switch may assume an on or off state as will be described in detail hereinafter.

Figure 16:
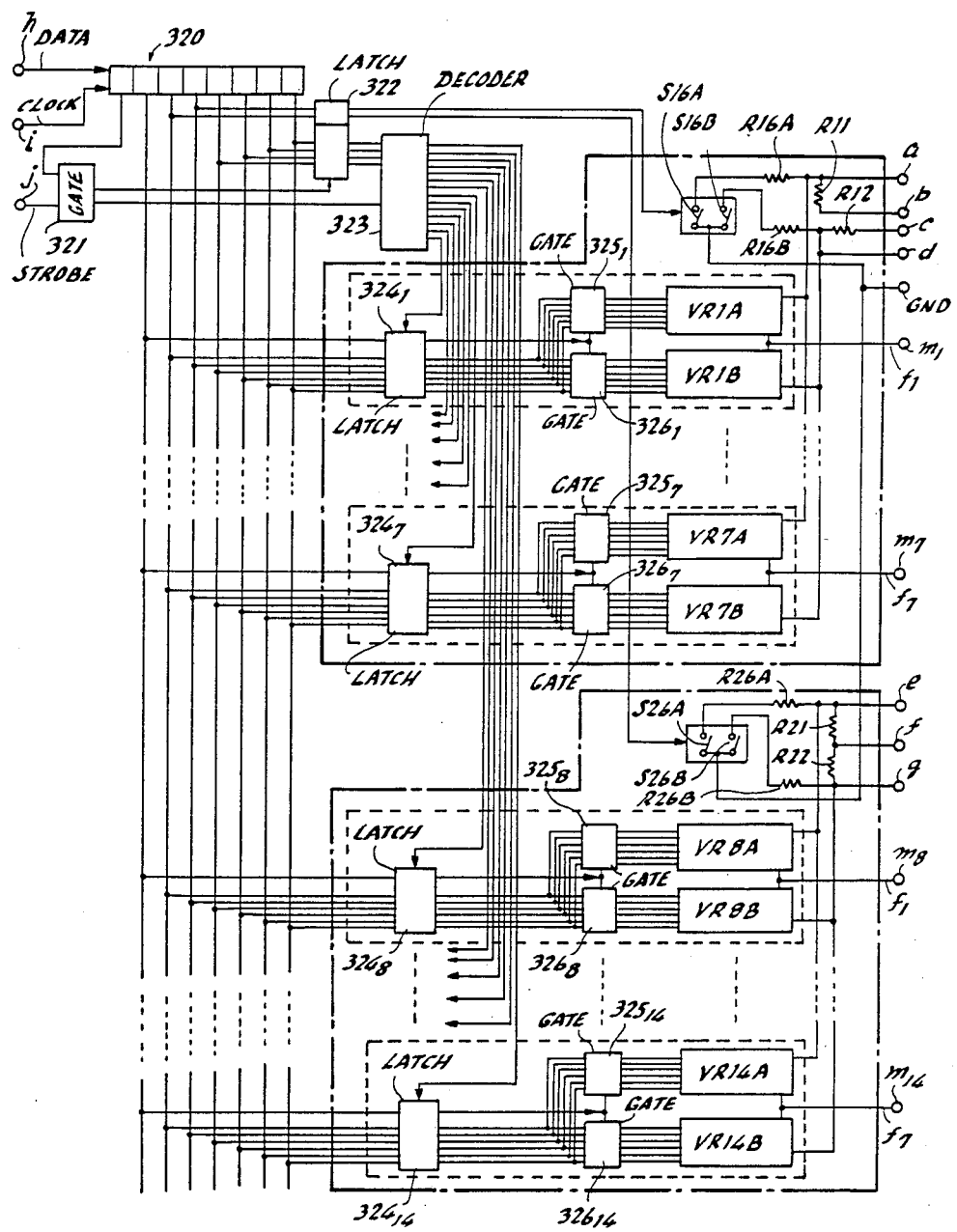
FIG. 16 is a schematic diagram of an integrated circuit which actualizes a main part of the frequency response control circuit of FIG. 14.

FIG. 16 shows a block diagram of the IC of FIG. 14 so that a detailed structure of the interface circuit 318 will be understood. In FIG. 16, portions other than the resistors R11, R12, R21, R22, R16A, R16B, R26A and R26B, the switches S16A, S16B, S26A and S26B, and the variable resistor circuits VR1A to VR14A and VR1B to VR14B, are parts or elements constituting the interface circuit 318.

The interface circuit 318 comprises a shift register 320, an input gate 321, latches 322, $324_1$ to $324_{14}$, a decoder 323, gates $325_1$ to $325_{14}$, $326_1$ to $326_{14}$. The shift register 320 is of serial-in, parallel-out type, and comprises an 8-bit storage whose serial input terminal is responsive to the data signals from the terminal h. The clock signal fed from the microcomputer 28 via the terminal i to the shift register 320 is used as a shift clock. The input gate 321, which may comprise two AND gates and an inverter (both not shown), is responsive to the strobe signal from the terminal j and one of the parallel outputs of the shift register 320. The latch 322 comprises first and second sections where the first section being of 2-bit, and the second section being of 4-bit, and the latch 322 is arranged to temporarily store 6 bits of the parallel outputs from the shift register 320. The latch 322 is enabled by a signal from the gate 321 when the eighth bit, i.e. the leftmost bit, from the shift register 320 is of logic "1" in the presence of the strobe signal. The decoder 323 is responsive to outputs from the second section of the latch 322 and is enabled by another output signal from the gate 321 when the eighth bit from the shift register 320 is of logic "0" in the presence of the strobe signal so as to decode data from the latch 322 to selectively enable one of the latches $324_1$ to $324_{14}$. Each of the latches $324_1$ to $324_{14}$ is responsive to first 7-bit data of the parallel outputs from the shift register 320 for temporarily storing the same, and output data therefrom is fed to the gates $325_1$ to $325_{14}$ and $326_1$ to $326_{14}$ respectively which are respectively enabled by one of the output signals from each of the latches $324_1$ to $324_{14}$. The gate circuits $325_1$ to $325_{14}$ and $326_1$ to $326_{14}$ may be buffer amplifiers arranged to output their input data in the presence of an enabling signal. The gate circuits $325_1$ to $325_{14}$ and $326_1$ to $326_{14}$ send their outputs as switch control signals used for respectively closing the switches S0 to S5 (see FIG. 15) of the variable resistor circuits VRiA and VRiB.

Output signals from the above-mentioned first section of the latch 322 are fed respectively to the two pairs of the switches S16A, S16B and S26A and S26B for selectively closing these switches. The variable resistor circuits VRiA are used for raising the level of the audio signal while the other variable resistor circuits VRiB are used for lowering the level of the same.

Figure 17:
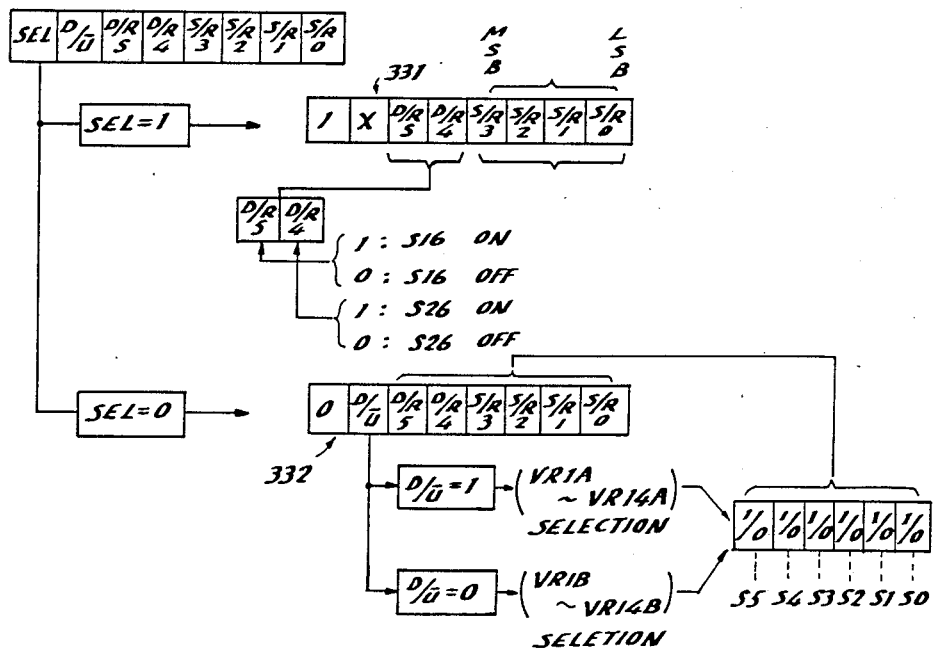
FIG. 17 is a diagram useful for understanding the operation of the integrated circuit of FIG. 16.

Prior to describing the operation of the circuits within the IC of FIG. 16, the contents of the instruction signal fed from the microcomputer 28 to the shift register 320 is described with reference to FIG. 17. FIG. 17 shows the contents of the 8-bit data stored in the shift register 320 in receipt of the data or control signal fed from the microcomputer 28 via the terminal h. First to fourth bits of each data word stored in the shift register 320 are designated at S/R; fifth and sixth bits being designated at D/R; seventh bit being designated at D/U; and an eighth bit being designated at SEL. This digital data fed from the microcomputer 28 may be either a first data word whose eighth bit SEL is of logic "1" or a second data word whose eighth bit SEL is of logic "0". The microcomputer 28 is arranged to normally output the first data word, and then outputs the strobe signal. Therefore, when the strobe signal is fed to the terminal j, the eighth bit SEL of the digital data stored in the shift register 320 is of logic "1" normally.

The first data word of 8-bit is designated at 331, while the second data word of 8-bit is designated at 332. The gate circuit 321 is responsive to the eighth bit SEL, which is of logic "1", and to the strobe signal from the terminal j so that a latch pulse is fed to the latch 322 and a decoder-enabling signal is fed to the decoder 323 in the presence of the strobe signal when the eighth bit SEL is of logic "1" or "0" as described in the above. As shown in FIG. 17, the seventh bit of the first data word 331 whose eighth bit is of logic "1", is indicated at X and is not used. Digital data formed by the first to fourth bits S/R of the first data word are stored in the second section of the latch 322 in the presence of the latch pulse fed from the gate circuit 321 in response to the strobe signal. Simultaneously, digital data formed by the fifth and sixth bits D/R are stored in the first section of the latch 322.

The data having the first to fourth bits S/R stored in the second section of the latch 322 are fed to the decoder 323 as a 4-bit digital data where the first bit is an LSB (least significant bit) and the fourth bit is an MSB (most significant bit). The decoder 323 decodes the 4-bit data from the latch 322 in response to the decoder-enabling signal from the gate circuit 321 so as to produce a latch pulse signal which selects one of the latches $324_1$ to $324_{14}$. Namely, the order of the latches $324_1$ to $324_{14}$ is indicated by a number of hexadecimal number system, which is obtained by decoding the first to fourth bits S/R. For instance, when the first to fourth bits assume "0111", this equals "7" in hexadecimal number system, and therefore, only the seventh latch $324_7$ receives the latch pulse. From the above, it will be understood that the first to fourth bits S/R of the first data word are used to designate one of the bands whose number is 14 in the embodiment of FIG. 16. To this end the first to fourth bits of the first data word assume a predetermined bit pattern among 14 bit patterns other than "0000" and "1111".

The fifth and sixth bits D/R are temporarily stored in the first section of the latch 322 so as to be used for controlling the analog switches S16A, S16B, S26A and S26B. When the fifth bit D/R4 is of logic "1", both the analog switches S26A and S26B are put in on state (closed state), and when the same bit is of logic "0", the switches S26A and S26B are rendered nonconductive (open or off state). Similarly, when the sixth bit D/R5 is of logic "1", both the analog switches S16A and S16B are put in on state, and when the same bit is of logic "0", the switches S16A and S16B are rendered nonconductive. From the above it will be understood that the fifth and sixth bits are used as switching data for the switches S16A, S16B, S26A and S26B, where these switches determine the amount of increase or decrease in the signal level caused by variation in the on-off state of the analog switches S0 to S5 of the variable resistor circuit VRiA or VRiB. In other words, while the level of the signal at each band will be increased or decreased depending on the on-off state of the analog switches S0 to S5 as will be described hereinafter, the amount of level change in each step of control is changed from 1 dB to 2 B or vice versa for instance. Therefore, these two bits D/R determine the level increase or decrease amount. In detail, when the analog switch S16A or S26A is in an off state, the resistor R16A or R26A is not connected in parallel to the series circuit of the variable resistor circuit VRiA or VRiB and the resonance circuit $17_i$, and thus the resistance between the terminal a and ground is simply determined by the resistance of the variable resistor circuit VRiA or VRiB. On the other hand, when the analog switch S16A or S26A is in an on state, the resistor R16A or R26A is coupled with the above-mentioned series circuit causing a resultant parallel resistance between the terminal a and ground to decrease.

The first data word 331 causes one of the latches $324_1$ to $324_{14}$, which is provided for a designated band, to perform latching operation until a subsequent first data word 331 is received, while the analog switches S16A, S16B, S26A and S26B are controlled such that a desired level adjusting amount is set.

The microcomputer 28 then sends the second data word 332 to the terminal h of the IC, and clock pulses to the terminal i. When all of the 8 bits of the second data word 332 have been sent to the shift register 320, the microcomputer 28 sends the strobe signal to the terminal j. At the time that the strobe signal is received, the eighth bit SET of the digital data stored in the shift register 320 is of logic "0", and the gate circuit 321 produces an output signal which causes the decoder 323 to produce a latching pulse with which the first to seventh bits of the digital data of the shift register 320 are temporarily stored in the latch $324_i$ corresponding to a designated band.

Among the seven bits stored in the latch $324_i$, the seventh bit D/U is fed to the gates $325_i$ and $326_i$. When this seventh bit is of logic "1", the gate $325_i$ is made open while the other gate $326_i$ is made closed. On the other hand when the seventh bit is of logic "0", the gate $325_i$ is made closed while the other gate $326_i$ is made open. As a result, digital data formed by the first to sixth bits among the seven bits stored in the latch $324_i$ is fed via one of the gates $325_i$ and $326_i$ to either the variable resistor circuit VRiA or VRiA so that the six analog switches S0 to S5 of the variable resistor circuit VRiA or VRiB are selectively closed depending on the logic state of the six bits. Namely, each bit of the first six bits from the shift register 320 corresponds to each one of the six analog switches S0 to S5. For instance, the first bit S/R0 is used to turn the analog switch S0 on and off, and the second to sixth bits are used to turn the remaining analog switches S1 to S5 on and off as shown in FIG. 17. In this embodiment, when each bit is of logic "1", the corresponding analog switch S1, S2 . . . is closed, and when logic "0", the same is made open.

As a result, resistor(s) connected to analog switch(es) S0, S1 . . . is(are) connected to the resonance circuit 17i. Therefore, when more than one analog switches S0, S1 . . . are closed, associated resistors R0, R1 . . . are coupled in parallel to obtain a resultant parallel resistance. Therefore, the resultant parallel resistance to be connected to the resonance circuit 17i decreases as the number of closed analog switches S0, S1 . . . increases.

Since either of the variable resistor circuit VRiA or VRiB is selected by the seventh bit D/U as described in the above, all the analog switches S0 to S5 of nonselected variable resistor circuit VRiA or VRiB are left open. Assuming that the variable resistor circuit VRiA is selected, it will be understood that the change in the resistance of the variable resistor circuit VRiA results in the change in the amount of negative feedback signal, which is fed back from the output of the operational amplifier 303 to the inverting input (−) of the same via the resistor R11 as shown in FIG. 14. In detail, the smaller the resultant parallel resistance of the variable resistor circuit VRiA, the smaller the amount of negative feedback signal. Namely, when the amount of negative feedback signal reduces, the loop gain of the operational amplifier 303 near the resonance frequency fi of the resonance circuit 17i increases, thereby increasing the level of the signal passing through the operational amplifier 303. From the above it will be understood that the variable resistor circuit VRiA causes the increase in the signal level at each band.

Now let us assume that the other variable resistor circuit VRiB is selected. The variable resistor circuit VRiB is connected in series with the resistor R12 such that a junction between them is used to derive an output voltage. In other words, the combination of the resistor R12 and the variable resistor circuit VRiB constitutes a voltage divider. Therefore, the smaller the resultant parallel resistance of the variable resistor circuit VRiB, the lower the voltage at the junction. As the result, the amount of attenuation increases as the resultant parallel resistance of the variable resistor circuit VRiB increases, thereby the signal level around the resonance frequency fi of the resonance circuit 17i is attenuated where the degree of attenuation is controlled by the number of closed analog switches S0 to S5 of the variable resistor circuit VRiB. From the above, it will be understood that the variable resistor circuit VRiB is used to determine the degree of attenuation of the audio signal.

As described in the above, the first and second data words 331 and 332 from the microcomputer 28 are respectively used to designate each band and provide necessary level increase or decrease so as to determine the signal level at each band. Since the first and second data words 331 and 332, which are of 8-bit, are sent via a single conductor line in a serial data form, only three signal lines are needed for sending the first and second data words 331 and 332, the clock pulse signal, and the strobe signal from the microcomputer 28 to the frequency response control circuit 14. Furthermore, the length of each digital word is of only 8-bit, and therefore, the structure of the interface 318 within the IC can be made simple. Because of not only such simple structure of the interface 318 but also the particular arrangement of the resistors R0 to R5 and the analog switches S0 to S5 in each variable resistor circuit VRiA or VRiB, the main part of the frequency response control circuit 14 of FIG. 2 can be actualized by an IC as shown in FIG. 14.

Figure 18:
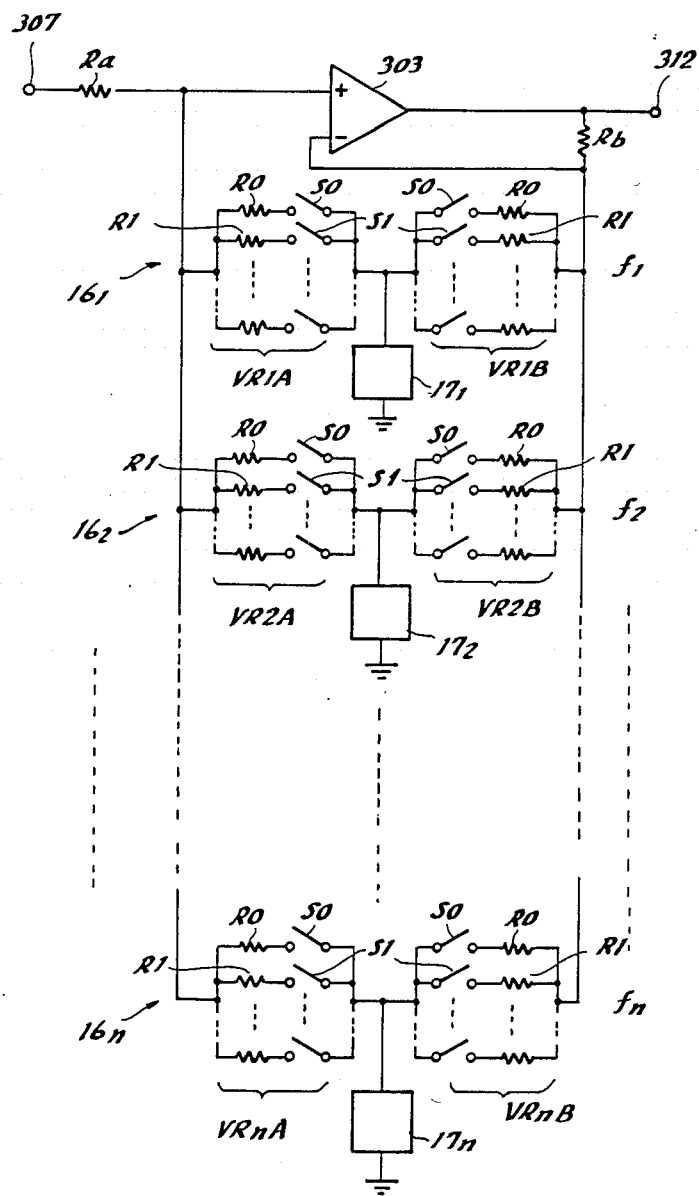
FIG. 18 is a schematic diagram of another example of the frequency response control circuit shown in FIG. 1.

FIG. 18 shows a modification of the frequency response control circuit 14 described in the above with reference to FIGS. 14 to 17. The circuit arrangement of FIG. 18 differs from the above-described one in that the variable resistor circuit VRiA is connected to the noninverting input (+) of the operational amplifier 303, while the other variable resistor circuit VRiB is connected to the inverting input (−) of the same. As a result, a resistor corresponding to the resistor R12 in FIG. 14 is not needed. The structure of the variable resistor circuits VRiA and VRiB is the same as that in FIGS. 14 to 16, and the way of control of the analog switches S0 to S5 included in each variable resistor circuit is also the same. Namely, an interface circuit similar to that shown in FIG. 16 is provided to control the analog switches S0 to S5. Although resistors corresponding to R16A, R16B, R26A and R26B, and associated switches are not shown in FIG. 18, such resistors and switches may be added if desired.

The above-described embodiments are just examples of the present invention, and therefore, it will be apparent for those skilled in the art that many modifications and variations may be made without departing from the spirit of the present invention.

What is claimed is:

1. A circuit arrangement for automatically giving a frequency response to an input audio signal, comprising:
    (a) a reference signal generator for producing a reference audio signal;
    (b) a selector for selecting said reference audio signal or said input audio signal from a signal source, said selector being controlled such that said reference audio signal is selected until a desired frequency response is given thereto;

(c) a frequency response control circuit responsive to a control signal for giving a given frequency response to an audio signal from said selector such that the level of said audio signal is controlled at n bands wherein n is a positive integer, said frequency response control circuit including:

an amplifier responsive to said audio signal from said selector, said amplifier having a negative feedback path;

a plurality of variable resistor circuits whose number is 2n, each of said variable resistor circuits having a parallel circuit of a plurality of series circuits of a resistor and an analog switch, a first group of n of said variable resistor circuits being connected to said negative feedback path to cause a loop gain of said amplifier to increase, and a second group of n of said variable resistor circuits being connected to said amplifier to cause the attenuation of the level of said audio signal;

a plurality of resonance circuits whose number is n, having different center frequencies within an audio frequency range, each of said resonance circuits being connected to two of said variable resistor circuits respectively belonging to said first and second groups;

an interface circuit responsive to said control signal for controlling on-off operation of said analog switches of said variable resistor circuits, said interface circuit having a shift register of serial-in, parallel-out type for receiving said control signal by shifting serial data in response to a clock pulse signal, a decoder responsive to some bits of parallel outputs from said shift register for producing a latching pulse to select one of said n bands, n latches arranged to be enabled by said latching pulse so that one of said n latches is used to store some of said bits of the parallel outputs from said shift register so as to control on-off operations of said analog switches of one of said variable resistor circuits corresponding to a designated band, and first means responsive to a timing signal and to one of said parallel outputs from said shift register for causing said decoder to output said latching pulse;

(d) a power amplifier responsive to an output signal from said frequency response control circuit for driving a loud speaker so that said audio signal passed through said frequency response control circuit is emitted to a sound field;

(e) second means responsive to an output signal from a microphone located in said sound field for picking up said audio signal, for analyzing frequency response at said n bands and for producing digital data indicative of a signal level at each of said n bands;

(f) storage means for storing digital data indicative of a plurality of frequency response curves; and (g) computing means responsive to said digital data from said second means and to said digital data from said storage means;

for computing the difference in signal level between said two digital data at each of said bands;

for producing said control signal by using the difference between said two digital data, said control signal including a first digital data word including information for designating one of said bands, and a second digital data word including information for designating signal level in each of said bands, said first and second digital data words having a serial format so that said first and second digital data words are fed to said interface circuit of said frequency response control circuit via a single line, said first and second digital data words including one bit indicating that the digital data word is either said first or second digital data word; and for producing said timing signal which will be used by said interface circuit for detecting said one bit for distinguishing said first digital data word from said second digital data word.

2. A circuit arrangement as claimed in claim 1, wherein said amplifier comprises an operational amplifier having a noninverting input for receiving said audio signal, an inverting input coupled via a feedback resistor with an output thereof, said first group variable resistor circuits being connected to said inverting input of the operational amplifier, said second group variable resistor circuits being connected to said output of said operational amplifier via an output resistor.

3. A circuit arrangement as claimed in claim 2, wherein said frequency response control circuit further comprises another operational amplifier functioning as a buffer amplifier responsive to a voltage divided by said output resistor connected to said output terminal of said first-mentioned operational amplifier and said second group variable resistor circuits.

4. A circuit arrangement as claimed in claim 2, wherein said frequency response control circuit further comprises a series circuit of a resistor and an analog switch interposed between said inverting input of said operational amplifier and ground; and wherein said interface circuit further comprises means responsive to one or more bits of said parallel outputs from said shift register for controlling said analog switch.

5. A circuit arrangement as claimed in claim 2, wherein said frequency response control circuit further comprises a series circuit of a resistor and an analog switch interposed between a junction of said output resistor connected to said operational amplifier and said second group variable resistor circuits; and wherein said interface circuit further comprises means responsive to one or more bits of said parallel outputs from said shift register for controlling said analog switch.

6. A circuit arrangement as claimed in claim 1, wherein said amplifier comprises an operational amplifier having a noninverting input for receiving said audio signal, an inverting input coupled via a feedback resistor with an output thereof, said first group variable resistor circuits being connected to said noninverting input of the operational amplifier, said second group variable resistor circuits being connected to said inverting input of said operational amplifier.

7. A circuit arrangement as claimed in claim 6, wherein said frequency response control circuit further comprises a series circuit of a resistor and an analog switch interposed between said noninverting input of said operational amplifier and ground; and wherein said interface circuit further comprises means responsive to one or more bits of said parallel outputs from said shift register for controlling said analog switch.

8. A circuit arrangement as claimed in claim 6, wherein said frequency response control circuit further comprises a series circuit of a resistor and an analog switch interposed between said inverting input of said operational amplifier and ground; and wherein said interface circuit further comprises means responsive to one or more bits of said parallel outputs from said shift register for controlling said analog switch.

9. A circuit arrangement as claimed in claim 1, wherein said storage means comprises a read-only memory in which data indicative of said plurality of frequency response curves is prestored, said computing means being responsive to manually inputted instructions so as to select one said plurality of frequency response curves for the comparison with the digital data from said analog-to-digital converting means.

10. A circuit arrangement as claimed in claim 1, further comprising a modulator and a demodulator for respectively converting digital data from said computing means into a signal to be magnetically recorded on a magnetic recording medium and converting a signal derived from said magnetic recording medium into a digital datum to be fed to said computing means so that digital data indicative of said plurality of frequency response curves is written and read out from said magnetic recording medium.

11. A circuit arrangement as claimed in claim 1, further comprising a second selector for selecting said audio signal from said microphone or said audio signal from said frequency response control circuit.

12. A circuit arrangement as claimed in claim 1, wherein said second means comprises a frequency response analyzing circuit including n filters responsive to the output signal from said microphone, n detectors respectively responding to output signals from said n filters, a third selector for selecting one of output signals from said n detectors at one time, and analog-to-digital converting means responsive to an output signal from said third selector for producing digital data indicative of signal level at each of said n bands.

13. A circuit arrangement as claimed in claim 1, further comprising a fourth selector for selecting output signal from a magnetic recording medium in a magnetic recording device or the output signal from said first selector so as to send a selected signal to said frequency response control circuit and to a demodulator which demodulates said signal from said magnetic recording medium into a digital signal to be fed to said computing means; a modulator responsive to digital data from said computing means for converting the same into a signal to be magnetically recorded; and a fifth selector for selecting the output signal from said frequency response control circuit or an output signal from said modulator for supplying a selected signal to said power amplifier and to said magnetic recording device.

14. A circuit arrangement as claimed in claim 1, further comprising a display control circuit responsive to signals from said frequency response analyzing circuit, and a display unit responsive to output signals from said display control circuit for displaying signal levels at respective bands.

* * * * *

UNITED STATES PATENT AND TRADEMARK OFFICE
CERTIFICATE OF CORRECTION

PATENT NO.   : 4,559,569
DATED        : December 17, 1985
INVENTOR(S)  : Zenju Otsuki and Mamoru Inami It is certified that error appears in the above—identified patent and that said Letters Patent is hereby corrected as shown below:

On the title page, Item [73] Assignee: should read
Victor Company of Japan, Limited, Yokohama, Japan Signed and Sealed this Twenty-second Day of April 1986

[SEAL]

Attest:

DONALD J. QUIGG

Attesting Officer

Commissioner of Patents and Trademarks